(12) United States Patent
Sharifi Tehrani

(10) Patent No.: US 11,704,178 B2
(45) Date of Patent: Jul. 18, 2023

(54) ESTIMATING A BIT ERROR RATE OF DATA STORED BY A MEMORY SUBSYSTEM USING MACHINE LEARNING

(71) Applicant: Micron Technology, Inc., Boise, ID (US)

(72) Inventor: Saeed Sharifi Tehrani, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 714 days.

(21) Appl. No.: 16/412,325

(22) Filed: May 14, 2019

(65) Prior Publication Data

US 2020/0364103 A1  Nov. 19, 2020

(51) Int. Cl.
*G06F 11/07* (2006.01)
*G11C 16/26* (2006.01)
*G06N 20/00* (2019.01)
*G06F 11/10* (2006.01)
*G11C 29/44* (2006.01)
*G11C 29/50* (2006.01)
*G06N 3/08* (2023.01)
(Continued)

(52) U.S. Cl.
CPC ........ *G06F 11/076* (2013.01); *G06F 11/0727* (2013.01); *G06F 11/1076* (2013.01); *G06N 20/00* (2019.01); *G11C 16/26* (2013.01); *G11C 29/44* (2013.01); *G11C 29/50* (2013.01); *G06F 3/0653* (2013.01); *G06F 11/00* (2013.01); *G06F 11/0793* (2013.01); *G06N 3/02* (2013.01); *G06N 3/08* (2013.01)

(58) Field of Classification Search
CPC .. G06F 3/0653; G06F 11/076; G06F 11/0727; G06F 11/1076; G06F 11/00; G06F 11/0793; G06N 3/08; G06N 20/00; G06N 3/0454; G06N 3/02; G11C 29/50; G11C 29/44
See application file for complete search history.

(56) References Cited

U.S. PATENT DOCUMENTS

2015/0135023 A1* 5/2015 Mekhanik ........... G06F 11/0727
714/704
2018/0067697 A1* 3/2018 Lee ....................... G06F 3/0656
(Continued)

OTHER PUBLICATIONS

International Search Report and Written Opinion, PCT App. No. PCT/US2020/032498, dated Aug. 24, 2020, 11 pages.

*Primary Examiner* — April Y Blair
*Assistant Examiner* — Sazzad Hossain
(74) *Attorney, Agent, or Firm* — Nicholson De Vos Webster & Elliott LLP

(57) ABSTRACT

Techniques for estimating raw bit error rate of data stored in a group of memory cells are described. Encoded data is read from a group of memory cells. A first population value is obtained based on a first number of memory cells in the group of memory cells having a read voltage within a first range of read voltages, each read voltage representing one or more bits of the encoded data. An estimated raw bit error rate of the data is determined to satisfy a first threshold. The determination is made using a first trained machine learning model and based in part on the first population value. A first media management operation is initiated in response to the determination that the estimated raw bit error rate satisfies the first threshold.

20 Claims, 8 Drawing Sheets

(51) Int. Cl.
    *G06F 3/06*      (2006.01)
    *G06N 3/02*      (2006.01)
    *G06F 11/00*    (2006.01)

(56) References Cited

U.S. PATENT DOCUMENTS

| | | |
|---|---|---|
| 2018/0357535 A1 | 12/2018 | Shulkin et al. |
| 2018/0358110 A1* | 12/2018 | Buyuktosunoglu ...... G06N 3/04 |
| 2019/0004734 A1 | 1/2019 | Kirshenbaum et al. |
| 2019/0066802 A1 | 2/2019 | Malshe et al. |
| 2019/0115078 A1 | 4/2019 | Kim et al. |

\* cited by examiner

ESTIMATING A BIT ERROR RATE OF DATA STORED BY A MEMORY SUBSYSTEM USING MACHINE LEARNING

TECHNICAL FIELD

The present disclosure generally relates to memory subsystems, and more specifically, relates to estimating the bit error rate of data stored by the memory subsystem using machine learning.

BACKGROUND ART

A memory subsystem can be a storage system, such as a solid-state drive (SSD), or a hard disk drive (HDD). A memory subsystem can be a memory module, such as a dual in-line memory module (DIMM), a small outline DIMM (SO-DIMM), or a non-volatile dual in-line memory module (NVDIMM). A memory subsystem can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
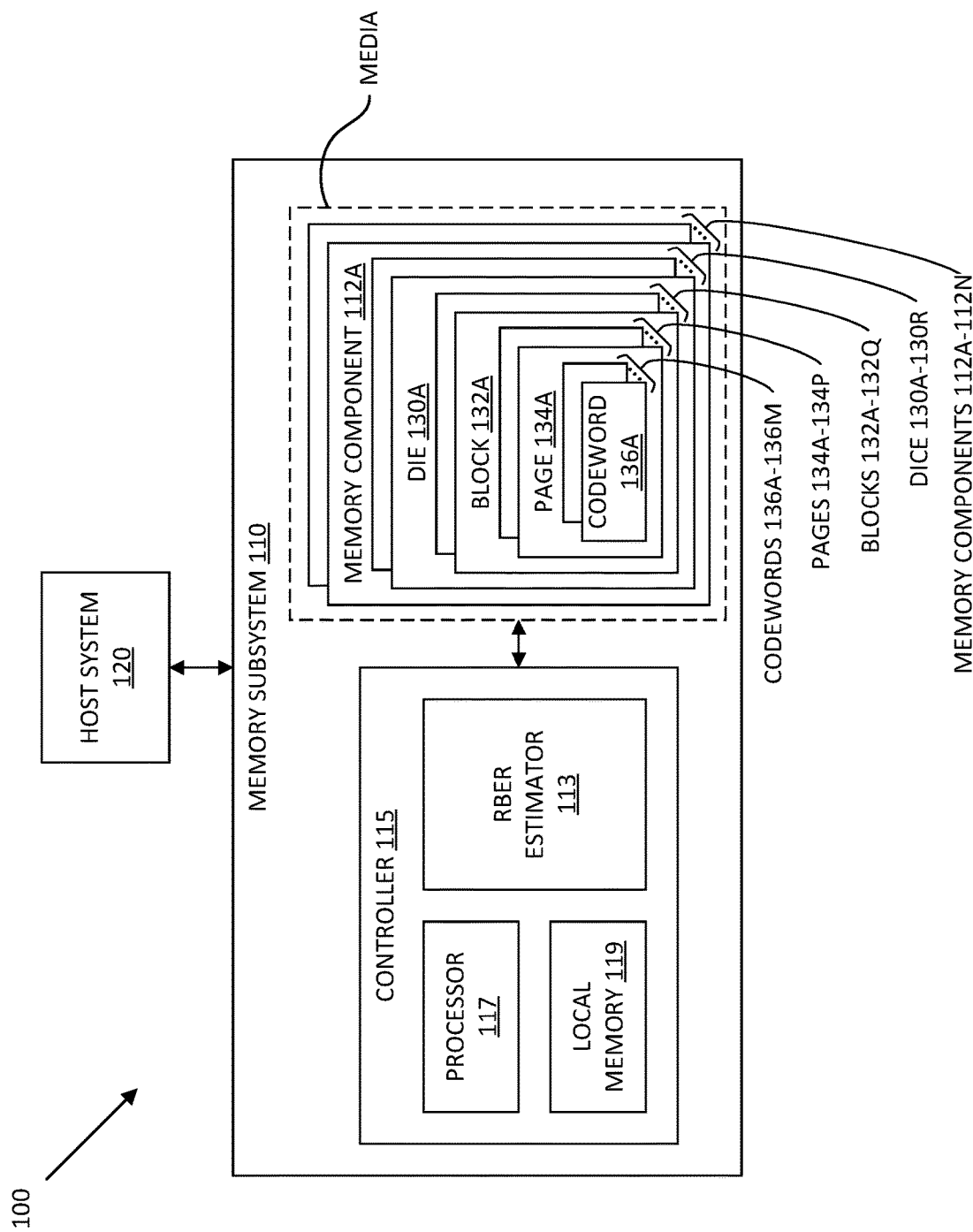
FIG. 1 illustrates an example computing environment that includes a memory subsystem in accordance with some embodiments of the present disclosure.

Aspects of the present disclosure are directed to a raw bit error rate (RBER) estimator in a memory subsystem. A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

A memory subsystem stores data on a media, which can be modeled as a noisy communications channel. That is, the data read from the media may not match the data written to the media due to noise associated with read and write operations, changes in physical characteristics of the media due to time and/or usage, media retention limits, etc. To account for changes in data between write and read operations, memory subsystems often employ error correcting codes (ECC). When writing data to the media, the memory subsystem encodes the data to be stored (e.g., with an ECC encoder) to include some redundancy and writes the encoded data to the media. Note that the encoded data is sometimes referred to as a codeword. When reading data from the media, the memory subsystem decodes the read codeword (e.g., with an ECC decoder) to obtain the stored data, leveraging the redundancy of the codeword to correct any changes relative to the data as it was intended to be stored. The number of bit changes is often referred to as the raw bit error rate (RBER). For example, if a codeword includes 512 bytes of data and, during decode operations, 12 of bits were changed, the RBER would be 12/4,096 or approximately 0.00293.

Many media management operations, such as those described herein, are conditioned on RBERs. Traditionally, obtaining the RBER for a given codeword or group of codewords required decoding the codeword(s) to identify the number of changed bits. ECC decoding operations are expensive in terms of both latency and power: ECC decode operations introduce delay between reading the data from the media and obtaining the RBER and often involve many calculations that contribute to an elevated power usage. If the read was performed to determine whether to trigger a media management operation and the obtained RBER did not merit the performance of the media management operation, the read still occupied the ECC decoder (be it a software process or hardware component) for a period of time that could block other ECC decode operations (e.g., those initiated by a host system) and contributed to increased power usage by the memory subsystem.

Aspects of the present disclosure address the above and other deficiencies by introducing techniques for estimating RBER without incurring the costs associated with ECC decoding operations. In particular, the memory subsystem includes an RBER estimator that employs one or more models trained using machine learning techniques to predict the RBER from one or more features available to or generated by the memory subsystem. Exemplary features include population data related to a number of memory cells storing certain values, the location of the memory cells on media, etc. The prediction can be based on a regression model that predicts an estimate of the RBER or a classification model that predicts whether the RBER is above or below a threshold or within one or more ranges of thresholds. The memory subsystem can leverage the predictions of the RBER estimator to defer the more expensive ECC decode operations to obtain actual RBERs and/or various media management operations.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

As illustrated, an exemplary media hierarchy includes the plurality of memory components 112A to 112N. Memory cells of the plurality of memory components can be physically and/or logically grouped based on how the cells are accessed. For example, different groups of memory cells can be accessed (e.g., for read, write, and/or erase operations) in parallel by virtue of having parallel access circuitry structures. In this example media hierarchy, each memory component 112 includes a single die or multiple dice 130A to 130R. Each die 130 includes one or more blocks 132A to 132Q of memory cells. Each block 132 includes one or more pages 134A to 134P of memory cells. Each page 134 stores one or more codewords 136A to 136M. Codewords 136 are ECC-encoded to allow correction of any changes in stored data due to noise sources.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other media management operations such as wear leveling operations, garbage collection operations, error detection and ECC operations, encryption operations, caching operations, and address translations between a logical block address and a physical block address that are associated with the memory components 112A to 112N. The controller 115 can be responsible for yet other media management operations such as calibrating voltage thresholds to distinguish amongst the multiple values represented by a voltage stored by a memory cell, checking the health of the valleys of a distribution of cell voltages, managing data retention by checking whether data written some time ago has an elevated RBER that merits decoding and re-writing to the media, etc. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes an RBER estimator 113 that can predict an RBER with relatively low power and latency relative to traditional ECC operations. In some embodiments, the controller 115 includes at least a portion of the RBER estimator 113. For example, the controller 115 can include a processor 117 (processing device) configured to execute instructions stored in local memory 119 for performing the operations described herein. In other embodiments, the RBER estimator 113 is part of the host system 120, an application, or an operating system. In yet other embodiments, the RBER estimator 113 is incorporated into logic or a local controller of a memory component 112 (not shown). For example, each memory component 112 can have access logic or a local controller that the controller 115 can issue operations to read data from or write data to the memory component 112. The RBER estimator 113 of a particular memory component 112 can provide the controller 115 with an RBER prediction as part of metadata provided with a read operation or in response to a separate operation to obtain an RBER prediction.

The RBER estimator 113 predicts the RBER of a logical grouping of data stored on the media based on one or more features that are available to or generated by the memory subsystem and without performing ECC decoding operations. Further details with regards to the various features, the training of the RBER estimator 113, and the operations of the RBER estimator 113 are described below.

Figure 2:
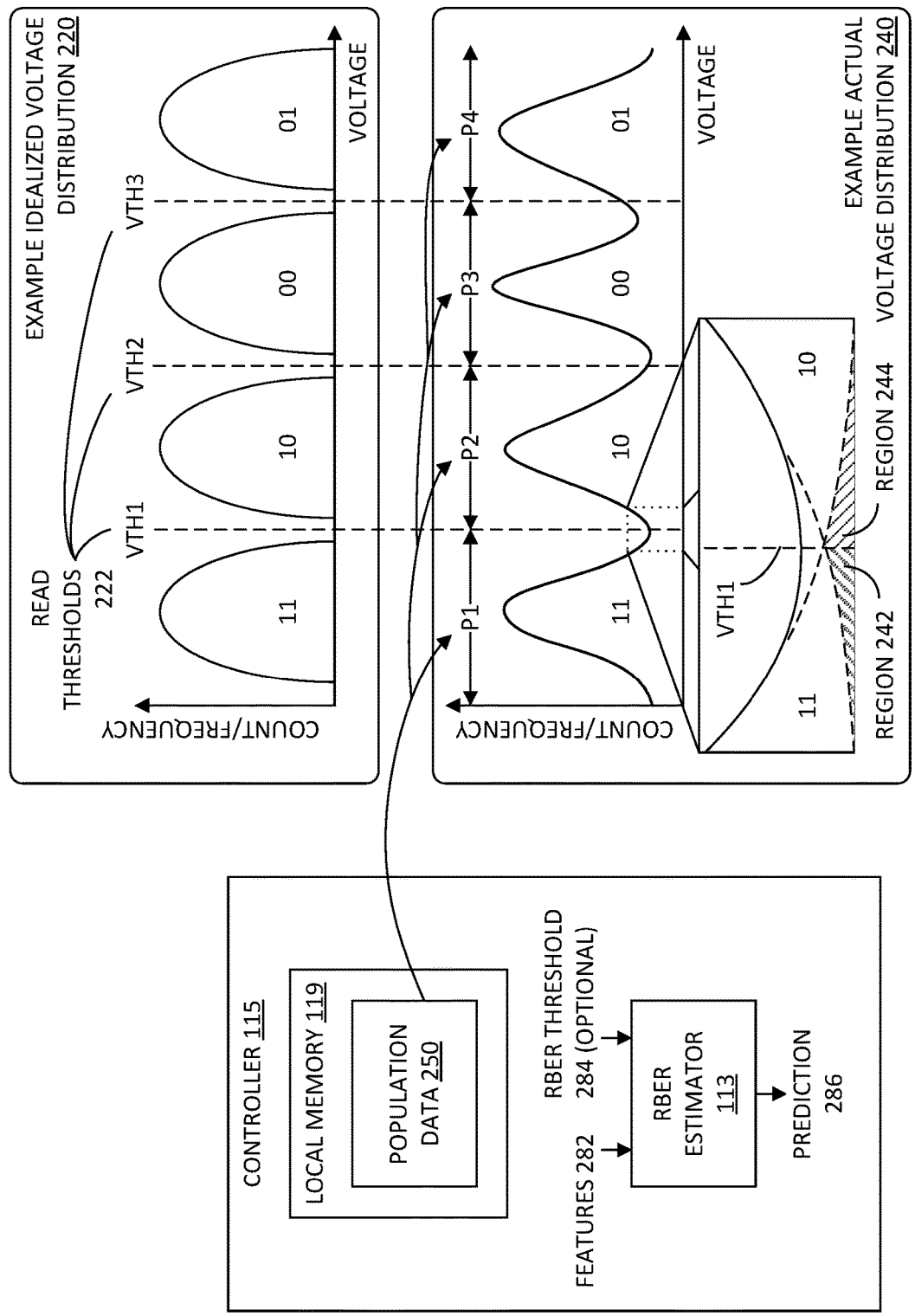
FIG. 2 illustrates an example of data population features that can be used to predict bit error rate in accordance with some embodiments of the present disclosure.

FIG. 2 illustrates an example of data population features that can be used to predict bit error rate in accordance with some embodiments of the present disclosure. When the controller 115 reads a group of memory cells from the media, the controller obtains population data related to the read or sensed voltages when accessing of the cells. The obtained population data can be accumulated by the controller 115 or obtained directly from another controller associated with a memory component 112 (not shown). The group of memory cells is a group of cells that can be read as a unit (e.g., a codeword 136, page 134, block, 132, etc.), and the population data indicates, relative to one or more read thresholds, which sensed voltages should be interpreted as which values. For example, in a NAND-based SLC, a single threshold distinguishes between 0's and 1's (e.g., read voltages above the threshold are interpreted as a 0 and read voltages below the threshold are interpreted as a 1). If the controller 115 reads a group of 1,000 memory cells, the population data could indicate the read voltages indicated that 700 memory cells stored a 0 and 300 memory cells stored a 1. Note that the population data can be normalized based on the total number of cells (e.g., 0.7 and 0.3 for 0's and 1's, respectively).

As illustrated in the example idealized voltage distribution 220, a distribution of read voltages from a group NAND-based MLCs storing two-bits per cell is plotted. In this example, three read thresholds 222 VTH1, VTH2, and VTH3 distinguish between the two-bit values 00, 01, 10, and 11. In particular, read voltages less than VTH1 correspond to a value of 11, read voltages between VTH1 and VTH2 correspond to a value of 10, read voltages between VTH2 and VTH3 correspond to a value of 00, and read voltages at or above VTH3 correspond to a value of 01. Notably, in this idealized example, the curve representing the 11 values does not extend beyond VTH1, the curve representing 10 does not extend below VTH1 or above VTH2, etc. Media with other type MLCs have different numbers of read thresholds (e.g., SLC has at least one read threshold; MLC with two-bits per cell has at least three read thresholds; TLC with three bits per cell has at least 7 read thresholds, QLC with four bits per cell has at least 15 read thresholds, etc.).

In reality, as illustrated in the example actual voltage distribution 240, the distribution curve is continuous and the read thresholds 222 result in some cells storing one two-bit value being interpreted as storing a different two-bit value—a source of RBER. As illustrated in the exploded view of the valley that spans VTH1, a tail of the 11 distribution extends above VTH1 and a tail of the 10 distribution extends below VTH1. Thus, cells falling into the read voltage region 242 that should be interpreted as storing a value 10 are interpreted as storing a value of 11, and cells falling into the read voltage region 244 that should be interpreted as storing a value of 11 are interpreted as storing a value of 10. Without the expense of performing ECC decoding operations, the controller does not know which cells had read voltages that fell within regions 242, 244.

To avoid or reduce the frequency of using ECC decoding operations, the controller 115 obtains population data 250, as described above and illustrated here as P1, P2, P3, and P4, where P1 corresponds to the number of memory cells with read voltages less than VTH1, P2 corresponds to the number of memory cells with read voltages between VTH1 and less than VTH2, P3 corresponds to the number of memory cells with read voltages between VTH2 and less than VTH3, and P4 corresponds to the number of memory cells with read voltages at or above VTH3. The population data can be raw count data related to the number of cells or normalized based on the number of cells read in the group.

The controller 115 provides one or more of the values from the population data 250 as features 282 to the RBER estimator 113, which in turn provides a prediction 286 of the RBER for the group of memory cells. In some embodiments, the controller 115 also provides an RBER threshold 284 to the RBER estimator 113 in cases where the RBER estimator 113 performs a classification to indicate whether the RBER is above or below the threshold 254. Additional details regarding these features are provided below with reference to FIGS. 4 and 5.

Figure 3:
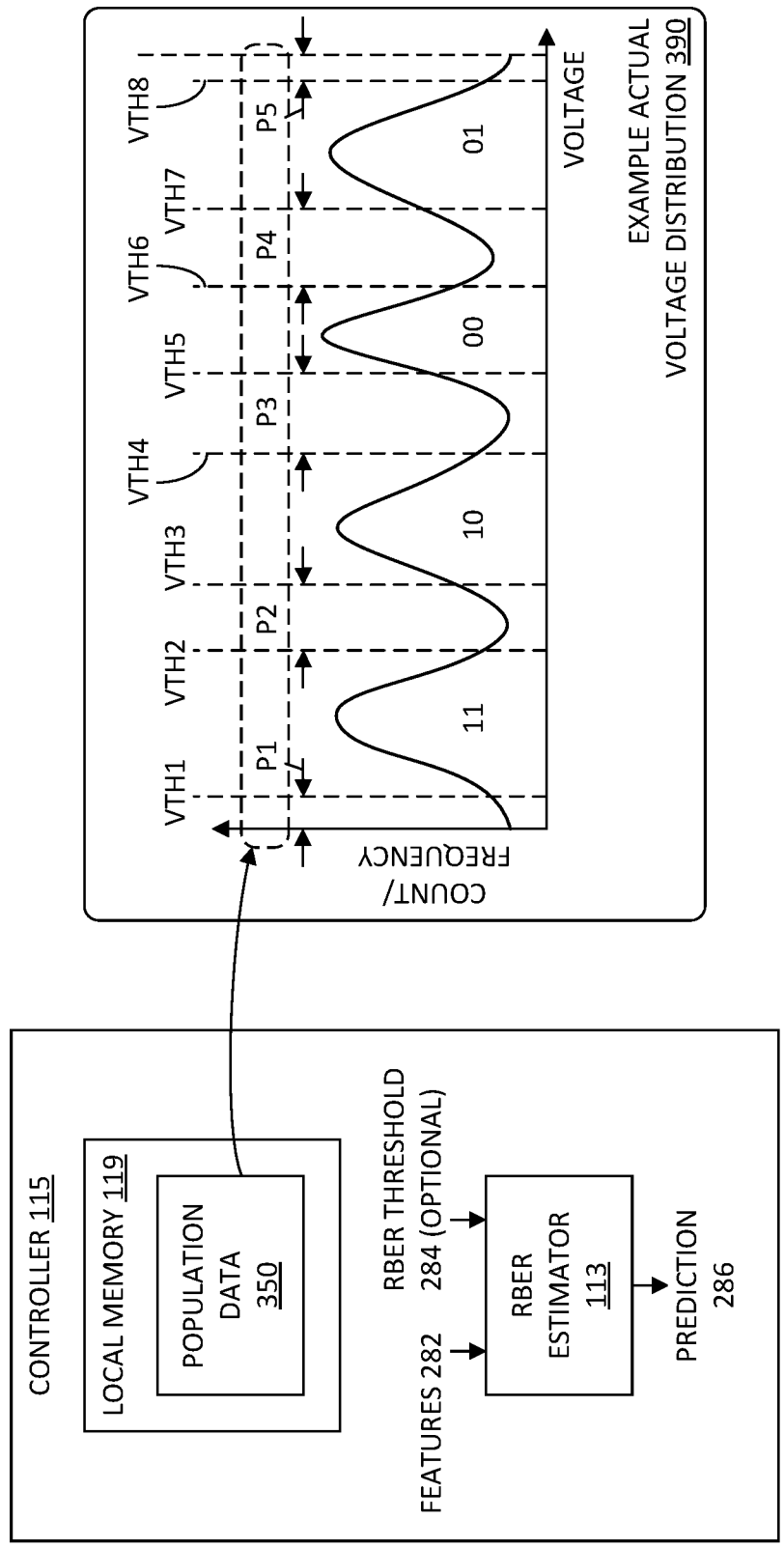
FIG. 3 illustrates another example of data population features that can be used to predict bit error rate in accordance with some embodiments of the present disclosure.

FIG. 3 illustrates another example of data population features that can be used to predict bit error rate in accordance with some embodiments of the present disclosure. In particular, FIG. 3 illustrates that population data can be sampled in different ways beyond that illustrated in the example actual voltage distribution 240. In the example actual voltage distribution 390, population data 350 is based on subsets of the overall population bounded by read thresholds that bookend expected valley locations of the distribution. For example, P1 corresponds to the number of memory cells with read voltages less than VTH1, P2 corresponds to the number of memory cells with read voltages between VTH2 and VTH3, P3 corresponds to the number of memory cells with read voltages between VTH4 and VTH5, P4 corresponds to the number of memory cells with read voltages between VTH6 and VTH7, and P5 corresponds to the number of memory cells with read voltages greater than VTH8. Population data can be based on other portions of a distribution than those illustrated in FIGS. 2 and 3, such as the peaks, combinations of peaks and valleys, other estimated features such as the gradient between peaks and valleys of a curve fit to the distribution, etc.

Figure 4:
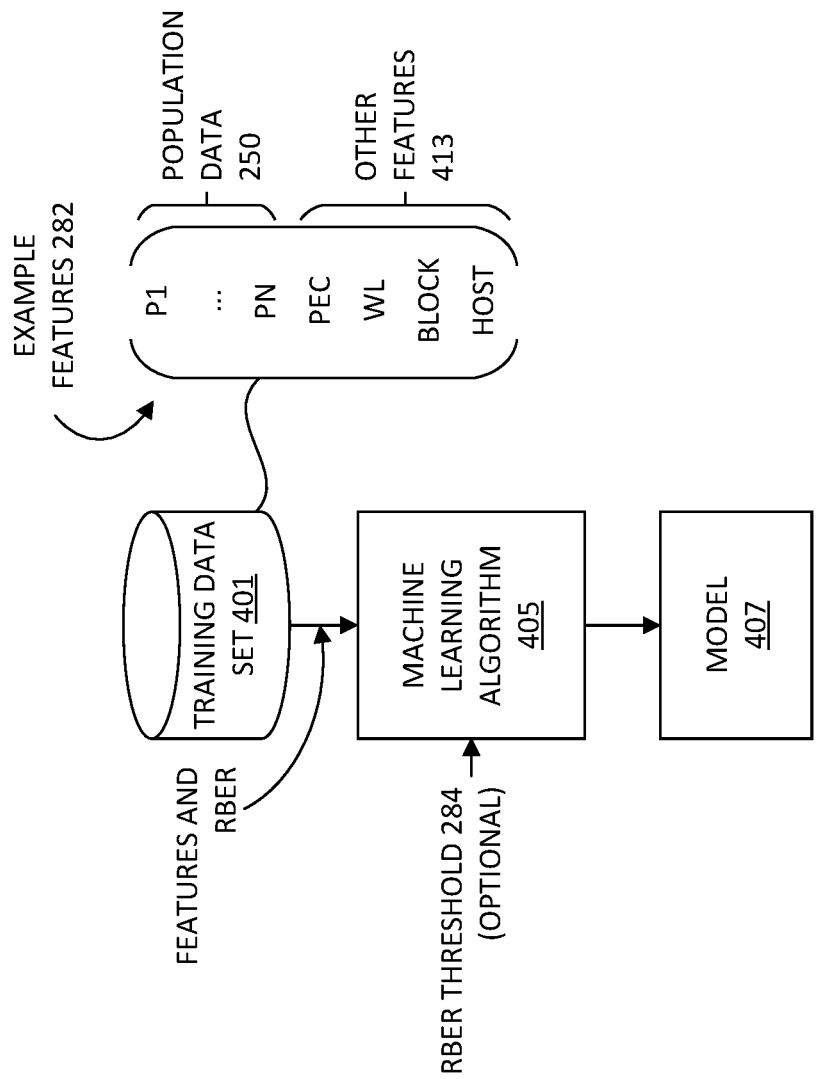
FIG. 4 illustrates an example technique for training a machine learning model to predict bit error rate in accordance with some embodiments of the present disclosure.
Figure 5:
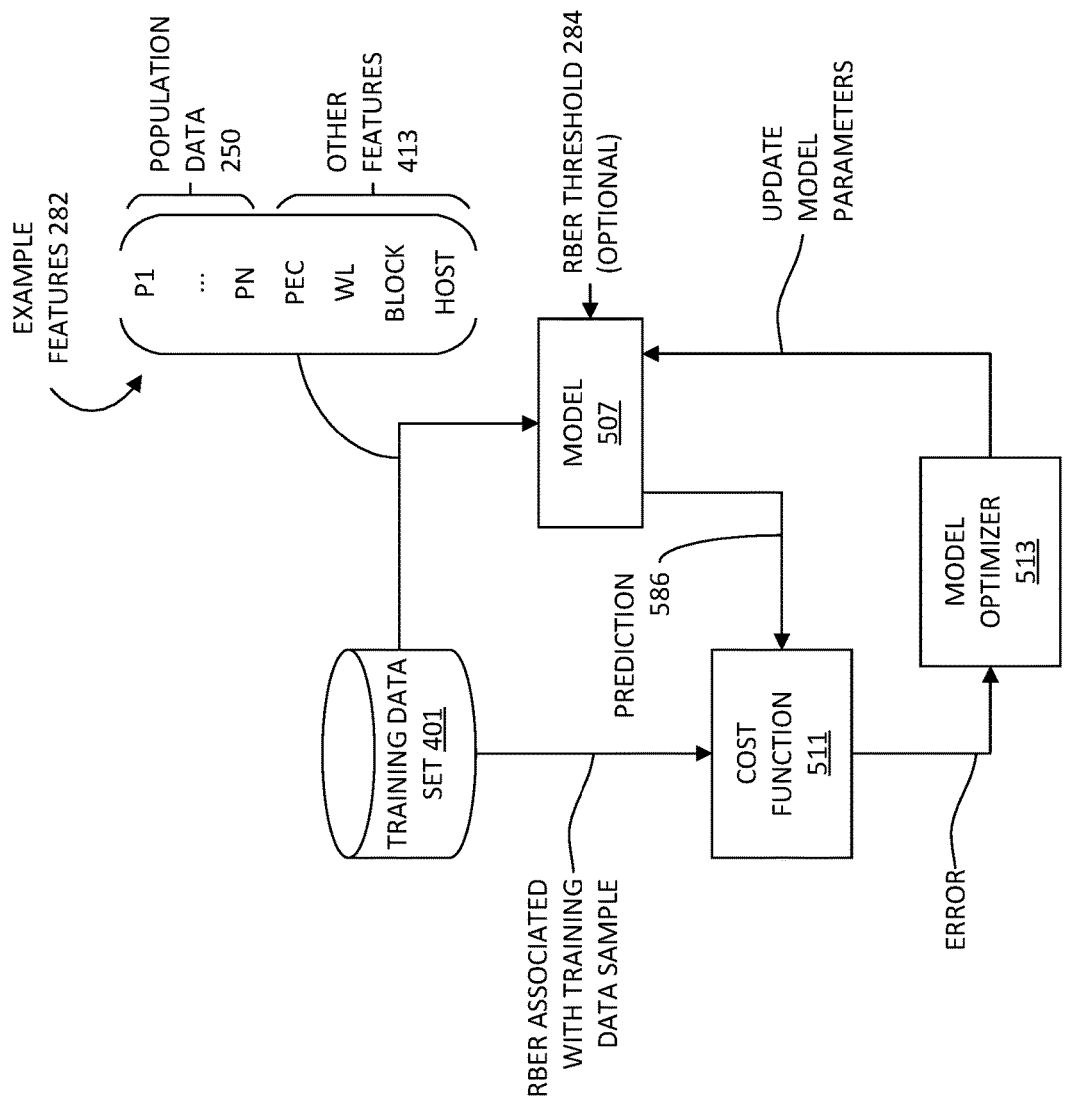
FIG. 5 illustrates another example technique for training a machine learning model to predict bit error rate in accordance with some embodiments of the present disclosure.

FIGS. 4 and 5 illustrate example techniques for training a machine learning model to predict bit error rate in accordance with some embodiments of the present disclosure. At a high level, machine learning techniques fit a model to data. The data can be split into a training data set to train a machine learning model which can be refined using a validation data set and have its performance measured using a test data set. A learned model can then be deployed to make predictions related based on new data. To increase the benefit of using an RBER estimator 113 relative to performing costly ECC decoding operations, the RBER estimator 113 is preferably computationally inexpensive (in terms of speed and/or latency and/or power consumption) as compared to ECC decoding operations. One inexpensive model that can be implemented by the RBER estimator 113 is a decision tree classifier that can provide an indication of whether the estimated RBER is above or below a threshold (in the case of a binary decision tree) or above one of many RBER thresholds (in the case of a multi-class decision tree). Such decision trees can be implemented in hardware using cascading logic gates or in software using conditional statements. FIG. 4 illustrates a training technique that can be used to generate a decision tree model 407, for example. As illustrated, the model 407 is trained from a training data set 401 using a machine learning algorithm 405. A computer system (not shown) can perform model training.

The training data set 401 includes many samples, each sample including features 282 associated with a given read operation of a group of memory cells where the actual RBER is known (e.g., based on ECC decoding). Typically, the higher the number of samples in the training data set 401, the more robust the resulting model, so long as the model is not overfit. The example features 282 include the population data (e.g., the population data 250 or 350) associated with a group of memory cells and can include other features 413, such as a PEC feature (a program-erase count associated with the group of cells), a WL feature (word line; in some architectures certain word lines can exhibit higher RBERs), an feature indicative of the block 132 or some other logical or physical grouping in a memory hierarchy that contains the group of cells, a feature indicative of a host (e.g., if the memory subsystem is incorporated into a multi-core or multi-processor system where different cores or processors have different host identifiers), etc. Of course, the features 282 available for model training can include more, fewer, or different features than illustrated.

The machine learning algorithm 405 looks at the features 282 and known RBER and attempts to iteratively generate decisions that maximize the information gain as characterized by a cost function. For example, if the model 407 being trained is a binary decision tree classifier to estimate whether an RBER given a set of features is above or below a threshold 284, and the cost function is set to the total number of errors (or error rate) that the machine learning algorithm attempts to minimize. For example, the first decision can divide the samples in the training data set 401 into two subsets, based on at least one feature and a decision threshold such that one subset has a high ratio of samples that exceed the threshold RBER to samples that do not and the other subset has a low ratio of samples that exceed the threshold RBER to samples that do not.

Exemplary decision tree machine learning algorithms 405 include ID3 (Iterative Dichotomiser 3), C4.5 (an extension of ID3), CART (Classification And Regression Tree), CHAID (Chi-square Automatic Interaction Detection), and others known to those skilled in the art. At a high level, the machine learning algorithm 405 gradually learns the decision tree model 407 by splitting/partitioning the training data set 401 into subsets based on one or more input features that lead to the lowest cost. The splitting process is repeated on each derived subset in a recursive manner subject to various parameters that limit the size of the tree. Exemplary parameters include the minimum leaf size (i.e., the smallest subset that will no longer be subdivided), the number of decisions (e.g., the total number of decisions in the tree), the depth of the tree (e.g., the maximum number of decisions between the first decision or root of the tree and a decision that provides a prediction), etc.

The cost function can be specified depending on the how the model 407 should be optimized. For example, the cost function can be defined to limit the overall error rate, the number of false positives, the number of false negatives. The decision on which error rate to use can be based on the sensitivity of a given memory subsystem to that type of errors. Some memory subsystems can be more sensitive to a false positive error (e.g., incorrectly estimating that the RBER is more than the input threshold) than a false negative error (e.g., incorrectly estimating that the RBER is less than the input threshold) due to the number of subsequent operations (e.g., ECC decoding operations, media management operations) that are triggered, while others can be more sensitive to false negatives (e.g., risking data loss). Other cost functions might be defined as a combination of some error (being it false positive, false negative, or overall error rate) with one or more non-error parameters (e.g., the number of decisions in the tree) to optimize both the error and the implementation complexity of the tree.

FIG. 5 illustrates another model training technique. In contrast to the decision tree machine learning algorithms that evaluate the entire population of samples in the training data set 401 or entire subsets of samples as a whole in order to identify each decision, other machine learning techniques iteratively evaluate individual samples of the training data set 401 to refine a model. As illustrated, the model 507 is trained from the training data set 401. A computer system (not shown) can perform model training. An exemplary model trained using the illustrated technique is a logistic regression model. For example, the logistic regression model 507 can predict RBER according to the following equation:

$$\text{Estimated RBER} = w_0 f_0 + \ldots + w_n f_n + b$$

where $f_0$ through $f_n$ correspond to features 282 as described herein, $w_0$ through $w_n$ correspond to learned weights, and b corresponds to an offset. Another exemplary model trained using the illustrated technique is a neural network model. The neural network model 507 can include one or more hidden layers that operate on an input layer that corresponds to the features 282 and outputs either an estimated RBER, a prediction vector that indicates the likelihood that the RBER is within certain ranges, a classification, etc.

During training, the model 507 processes a sample and generates a prediction 586. A cost function 511 compares the prediction 586 to the actual RBER associated with the sample from the training data set 401. A model optimizer 513 evaluates the output of the cost function—sometimes referred to as the error—and updates the parameters of the model 507. An exemplary cost function 511 calculates the difference between the estimated RBER and the actual RBER associated with the sample from the training data set 401. An exemplary model optimizer 513 could employ the stochastic gradient descent algorithm to iteratively reduce the error.

Once trained, a model (e.g., the model 407, 507) can be implemented as part of an RBER estimator 113. Note that a trained model can depend on fewer features 282 than were available in the training data set 401. That is, the trained model may be sensitive to some subset of the example features 282 illustrated in FIGS. 4 and 5 (e.g., three of four population values and PEC).

Figure 6:
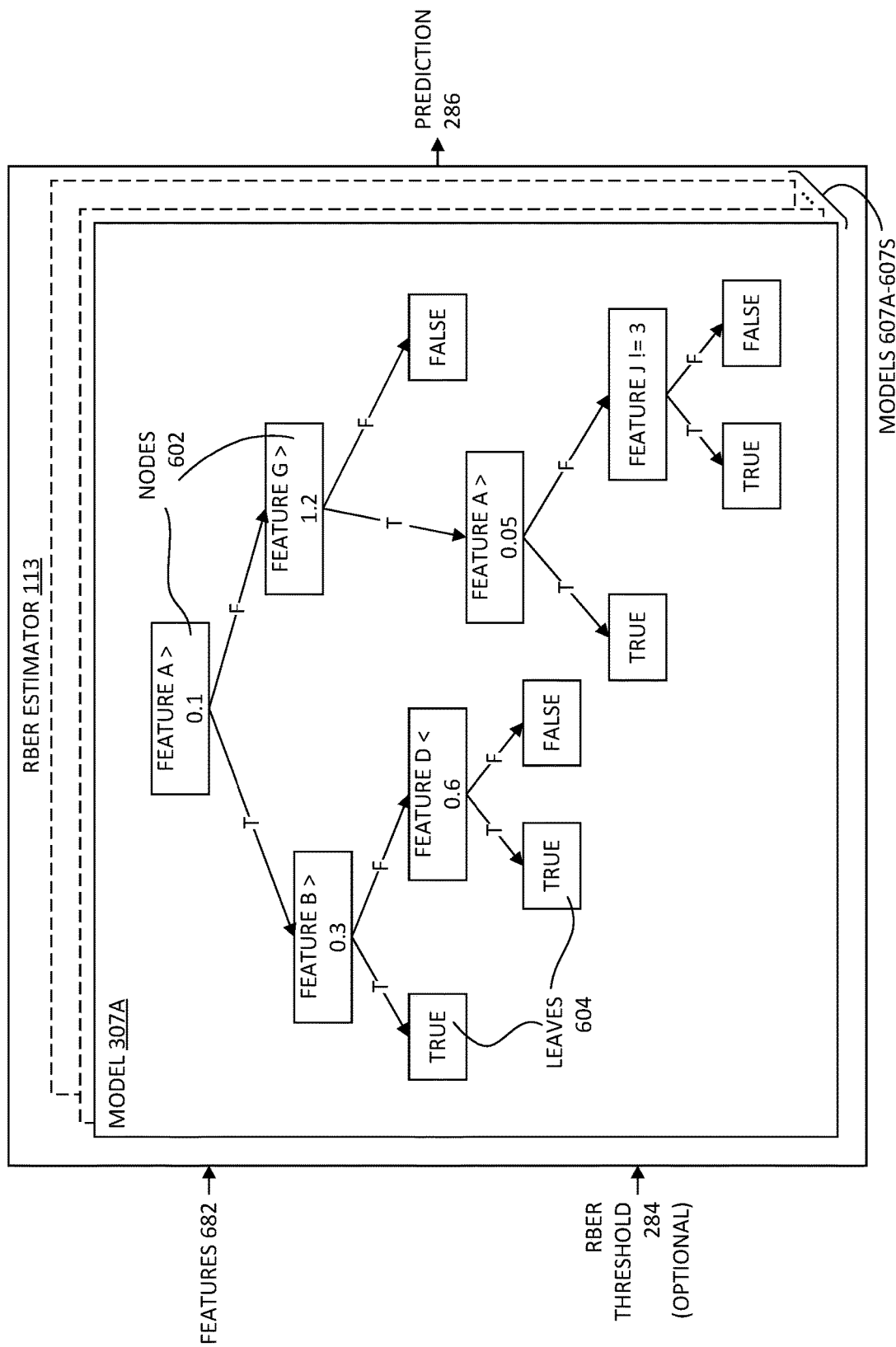
FIG. 6 illustrates an example implementation of a trained model in accordance with some embodiments of the present disclosure.

FIG. 6 illustrates an example implementation of a trained model in accordance with some embodiments of the present disclosure. As illustrated, the RBER estimator 113 can implement one or more models 607A to 607S (e.g., such as models 407, 507). In an RBER estimator 113 with multiple models, different models 607 can be used for different purposes. For example, some media management operations can be triggered in response to different estimated RBER thresholds 284. The RBER estimator 113 can employ one model 607 for one RBER threshold 284 and another model 607 for a different RBER threshold 284. Further, different models 607 can generate different types of predictions. As a classifier, one model 607 can generate a prediction of whether the estimated RBER is above a threshold 284 or within some range. In the regression context, another model 607 can generate an estimated value of the RBER. Additionally, different models 607 can depend on different input features 682 (e.g., a decision tree classifier model can be sensitive to a different set of features than a logistic regression model).

As illustrated, the model 607A is a binary decision tree classifier (e.g., model 407) that determines whether the RBER is above or below a threshold 284. The illustrated model 607A includes several levels of decision nodes 602 that lead to leaves 604 that indicate whether the RBER is above or below the threshold 284. Each condition can evaluate one or more features. For example, the RBER is estimated to exceed the threshold 284 if "FEATURE A" is greater than 0.1 and "FEATURE B" is greater than 0.3. As another example, the RBER is estimated not to exceed the threshold 284 if "FEATURE A" is less than 0.1 and "FEATURE G" is less than 1.2. Such a binary decision tree classifier can be implemented, for example, in hardware using cascaded comparators.

Figure 7:
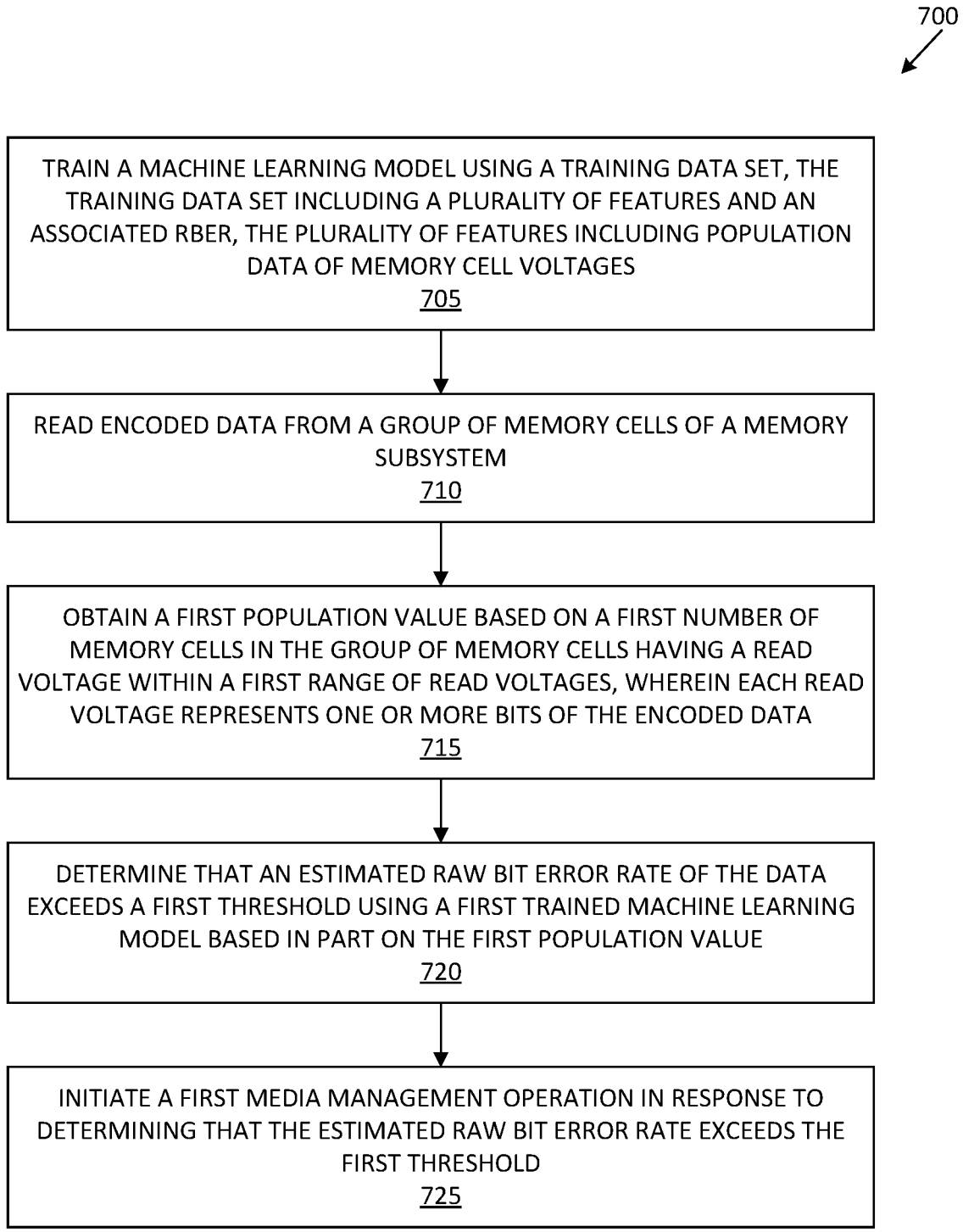
FIG. 7 is a flow diagram of an example method to train and use a bit error rate estimation model in accordance with some embodiments of the present disclosure.

FIG. 7 is a flow diagram of an example method 700 to train and use a bit error rate estimation model in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more of the processes of the method 700 is performed by the RBER estimator 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, a first processing device, such as a processor of a computer system, trains a machine learning model using a training data set. As described herein, a trained model can be used to generate a prediction of a RBER associated with data stored in a group of memory cells of a memory subsystem based on one or more features included in the training data set. Such features can include population data representing read voltages of groups of memory cells, which can be normalized. Additional features include a PEC and various identifications related to the location of a given group of memory cells such as its block, page, wordline, and/or host system that originated the data being stored. Various machine learning techniques can be used to train the model, including those described above with reference to FIGS. 4 and 5.

At operation 710, a second processing device, such as the controller 115 or logic or a local controller of a memory component 112, reads encoded data from a group of memory cells of a memory subsystem. Such groups of memory cells can store one or more codewords that represent encoded data or data protected by ECC. Electrical characteristics of each cell, such as a read voltage, represents one or more bits—1's and 0's—of the stored, encoded data. Note that in some embodiments, the second processing device can be the first processing device such as in systems where a host system processor serves as the controller of the memory subsystem At operation 715, the second processing device obtains a first population value based on a first number of memory cells in the group of memory cells having a read voltage within a first range of read voltages, wherein each read voltage represents one or more bits of the encoded data. As described herein, population data can be used to represent the count or frequency of cells within a group of cells that include the electrical characteristic within a range. For example, population data 250 and population data 350, as illustrated and described above for FIGS. 2 and 3, includes values representing counts or frequencies of cells between various read voltage thresholds.

At operation 720, the second processing device determines that an estimated raw bit error rate of the data exceeds a first threshold using a first trained machine learning model based in part on the first population value. The machine learning model trained at operation 705 can be loaded to a controller 115 of a memory subsystem and implemented using a combination of software and/or firmware. In one embodiment, the machine learning model is implemented as the RBER estimator component 113 of the controller 115. The machine learning model accepts as inputs one or more features associated with a group of memory cells and generates an RBER prediction. For models that estimate an RBER value, the controller 115 can compare the estimated RBER value to one or more thresholds. For models that classify the RBER based on an input threshold, the controller 115 obtains from the RBER estimator component 113 an indication of whether the model predicts the RBER of the group of memory cells exceeds the input threshold. In either case, when the predicted RBER does not exceed a threshold, the second processing can avoid performing ECC decoding operations.

Note that in various embodiments, parameters representative of the raw bit error rate can be used and different thresholds evaluated accordingly. For example, some machine learning models may generate a parameter that negatively correlates with RBER (e.g., the parameter decreases as RBER increases). In such a scenario, the second processing device can determine that the parameter has fallen below a threshold (rather than the RBER exceeding a threshold). In general, the second processing device determines that the RBER or some parameter indicative of RBER has satisfied a threshold using the first trained machine learning model.

At operation 725, the second processing device initiates a first media management operation in response to determining that the estimated raw bit error rate exceeds the first threshold. As described above, implementing a mechanism to predict RBER without performing costly ECC decoding operations can reduce power consumption and increase the performance of a memory subsystem. Various media management operations are triggered in response to elevated RBER, such as read voltage threshold calibration and data retention algorithms can be performed to improve read threshold positions and avoid data loss, as described herein. ECC decoding operations that would typically trigger such media management operations can be deferred until a predicted RBER exceeds the threshold as determined at operation 720. For example, if the RBER prediction indicates an elevated RBER, the controller 115 can decode the encoded data using the ECC decoder to correct any errors, re-encode the decoded data, and re-write the newly encoded data to the media. As another example, the controller 115 can obtain multiple RBER predictions while adjusting read voltage thresholds to optimize the read voltage thresholds toward a minimum RBER prediction without invoking ECC decoding. The controller 115 can read data from the media with a first set of one or more read voltage thresholds and obtain an associated RBER prediction. The controller 115 can then read the same data from the media with a second set of one or more read voltage thresholds, at least one read voltage threshold of the second set being adjusted relative to a corresponding read voltage threshold in the first set. With reference to FIG. 2, the controller 115 can read data using VTH1, VTH2, and VTH3 as a first set of read threshold voltages, and VTH1+n, VTH2, and VTH3 as a second set of read threshold voltages where n is an offset. Repeating that process, the controller 115 can iteratively adjust read threshold voltages until a minimum RBER prediction is reached and use that set of read threshold voltages when reading data from the media.

Note that while the present disclosure references the use of a machine learning model to estimate RBER, machine learning models can be trained to make predictions related to other media data quality metrics. Such metrics can be related to or a function of RBER. For example, a high reliability error rate (HRER) that represents a number of bits in error whose log likelihood ratio (LLR) has a high magnitude can be predicted using a machine learning model.

Figure 8:
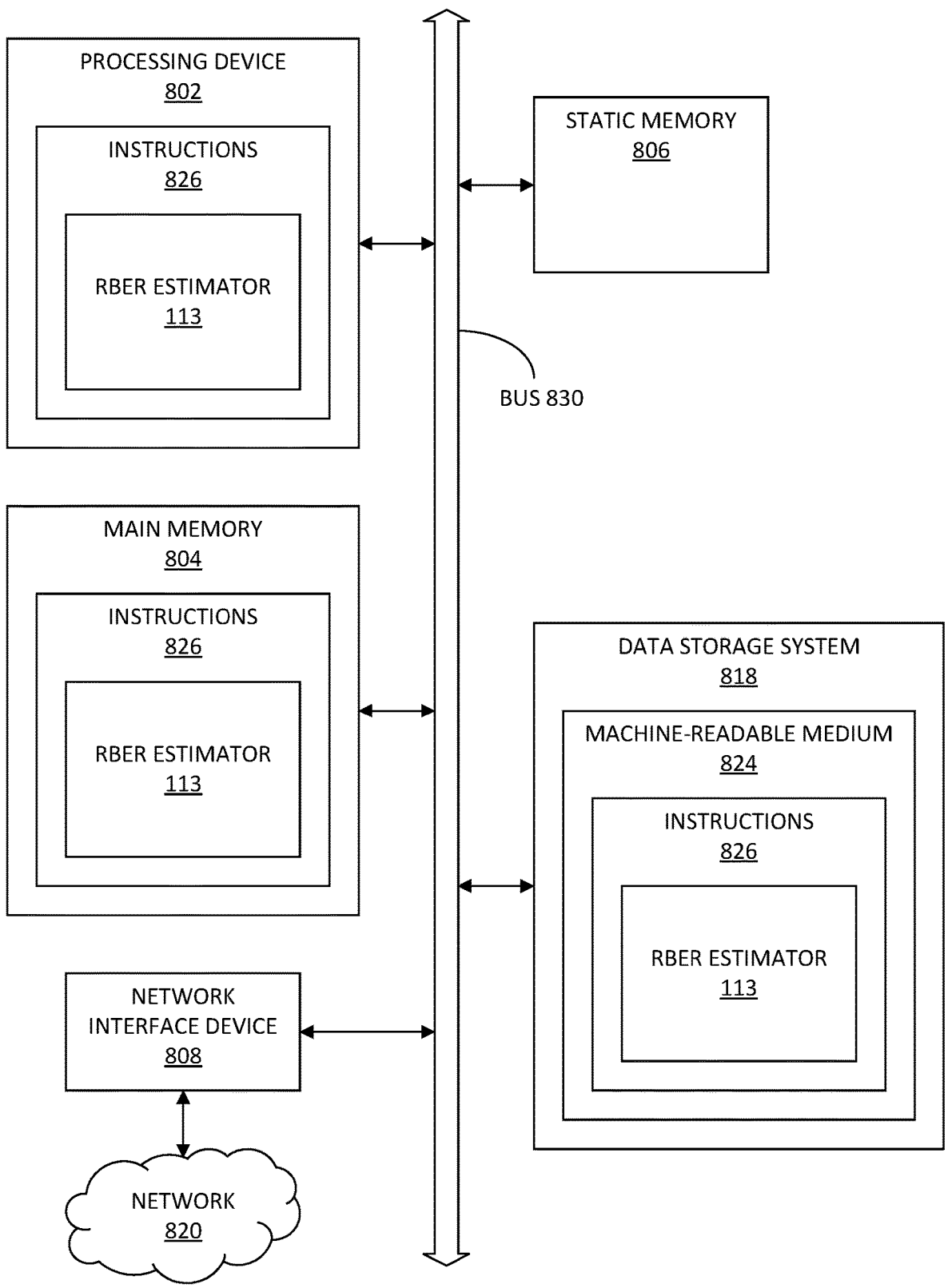
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the RBER estimator 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Furthermore, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory subsystem 110 of FIG. 1.

In one embodiment, the instructions 826 include instructions to implement functionality corresponding to a RBER estimator (e.g., the RBER estimator 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out a portion of the computer-implemented method 700 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the various embodiments described above and in the following claims, unless specifically noted otherwise, disjunctive language such as the phrase "A, B, or C" is intended to be understood to mean either A, B, or C, or any combination thereof (e.g., A, B, and/or C). As such, disjunctive language is not intended to, nor should it be understood to, imply that a given embodiment requires at least one of A, at least one of B, or at least one of C to each be present, or that only one of A, B, or C is present.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   reading encoded data from a group of memory cells of a memory subsystem;
   obtaining population data for a number of memory cells in the group of memory cells having a read voltage within a range of read voltages the population data comprising:
   a first number of memory cells with a read voltage less than a first threshold voltage; and
   a second number of memory cells with a read voltage greater than the first threshold voltage and less than a second threshold voltage;
   predicting, using a first trained machine learning model, that an estimated raw bit error rate of the encoded data satisfies a first threshold using the population data, wherein the estimated raw bit error rate is determined without performing an error correcting code decoding operation on the encoded data; and
   initiating a first media management operation in response to determining that the estimated raw bit error rate satisfies the first threshold.

2. The method of claim 1, further comprising:
   obtaining additional population data using additional number of memory cells in the group of memory cells having a read voltage within a different range of read voltages, the additional population data comprising at least one of:
   a third number of memory cells with a read voltage greater than the second threshold voltage and less than a third threshold voltage; and
   a fourth number of memory cells with a read voltage greater than the third threshold voltage and less than a fourth threshold voltage; and
   wherein:
   the estimated raw bit error rate of the data is further based on the additional population data; and
   the range of read voltages does not overlap with the different range of read voltages.

3. The method of claim 1, wherein the estimated raw bit error rate is further based on:
- a program-erase count of the group of memory cells,
- a block of memory cells including the group of memory cells,
- an indication of a word line that includes one or more of the group of memory cells, or
- an indication of a host that provided unencoded data that was encoded and stored as the encoded data in the group of memory cells.

4. The method of claim 1, further comprising selecting the first trained machine learning model based on the first media management operation.

5. The method of claim 1, wherein the first media management operation is:
- a calibration of threshold voltages used to interpret read voltages stored by a memory cell,
- a data retention check to determine whether the encoded data should be decoded, re-encoded, and re-written to the memory subsystem, or
- an error-correcting code decode operation.

6. The method of claim 1, wherein the first trained machine learning model is a decision tree model, a neural network model, or a logistic regression model.

7. The method of claim 1, further comprising:
- determining, using a second trained machine learning model, that an estimated raw bit error rate based on the population data, satisfies a second threshold; and
- initiating a second media management operation in response to determining that the estimated raw bit error rate satisfies the second threshold, wherein the second media management operation is a different type operation than the first media management operation.

8. A non-transitory computer-readable storage medium comprising instructions that, when executed by a processing device, cause the processing device to:
- read encoded data from a group of memory cells of a memory subsystem;
- obtain population data for a number of memory cells in the group of memory cells having a read voltage within a first range of read voltages, the population data comprising at least one of:
  - a first number of memory cells with a read voltage less than a first threshold voltage; and
  - a second number of memory cells with a read voltage greater than a first threshold voltage and less than a second threshold voltage;
- predicting, using a first trained machine learning model, that an estimated raw bit error rate of the encoded data satisfies a first threshold using the population data, wherein the estimated raw bit error rate is determined without performing an error correcting decoding operation on the encoded data; and
- initiate a first media management operation in response to determining that the estimated raw bit error rate satisfies the first threshold.

9. The non-transitory computer-readable storage medium of claim 8, wherein the processing device is further to:
- obtain additional population data using a additional number of memory cells in the group of memory cells having a read voltage within a different range of read voltages, the additional population data comprising at least one of:
  - a third number of memory cells with a read voltage greater than the second threshold voltage and less than a third threshold voltage; and
  - a fourth number of memory cells with a read voltage greater than the third threshold voltage and less than a fourth threshold voltage; and
- wherein:
  - the estimated raw bit error rate of the data is further based on the additional population data; and
  - the range of read voltages does not overlap with the different range of read voltages.

10. The non-transitory computer-readable storage medium of claim 8, wherein the estimated raw bit error rate is further based on:
- a program-erase count of the group of memory cells,
- a block of memory cells including the group of memory cells,
- an indication of a word line that includes one or more of the group of memory cells, or
- an indication of a host that provided unencoded data that was encoded and stored as the encoded data in the group of memory cells.

11. The non-transitory computer-readable storage medium of claim 8, wherein the processing device is further to select the first trained machine learning model based on the first media management operation.

12. The non-transitory computer-readable storage medium of claim 8, wherein the first media management operation is:
- a calibration of threshold voltages used to interpret read voltages stored by a memory cell,
- a data retention check to determine whether the encoded data should be decoded, re-encoded, and re-written to the memory subsystem, or
- an error-correcting code decode operation.

13. The non-transitory computer-readable storage medium of claim 8, wherein the first trained machine learning model is a decision tree model, a neural network model, or a logistic regression model.

14. The non-transitory computer-readable storage medium of claim 8, wherein the processing device is further to:
- determine, using a second trained machine learning model, that an estimated raw bit error rate based on the population data satisfies a second threshold; and
- initiate a second media management operation in response to determining that the estimated raw bit error rate satisfies the second threshold, wherein the second media management operation is a different type operation than the first media management operation.

15. A system comprising:
- a memory component; and
- a processing device, operatively coupled with the memory component, to:
  - read encoded data from a group of memory cells of the memory component;
  - obtain population data for a first number of memory cells in the group of memory cells having a read voltage within a range of read voltages the population data comprising at least one of:
    - a first number of memory cells with a read voltage less than a first threshold voltage; and
    - a second number of memory cells with a read voltage greater than a first threshold voltage and less than a second threshold voltage;
  - obtain additional population data using an additional number of memory cells in the group of memory cells having a read voltage within a different range of read voltages, wherein the range of read voltages does not overlap with the different range of read voltages;

predicting, using a first trained machine learning model, that an estimated raw bit error rate of the encoded data satisfies a first threshold using the population data and the additional population data, wherein the estimated raw bit error rate is determined without performing an error correcting code decoding operation on the encoded data; and initiate a first media management operation in response to determining that the estimated raw bit error rate satisfies the first threshold.

16. The system of claim 15, wherein the estimated raw bit error rate is further based on:

a program-erase count of the group of memory cells, a block of memory cells including the group of memory cells, an indication of a word line that includes one or more of the group of memory cells, or an indication of a host that provided unencoded data that was encoded and stored as the encoded data in the group of memory cells.

17. The system of claim 15, wherein the processing device is further to select the first trained machine learning model based on the first media management operation.

18. The system of claim 15, wherein the first media management operation is:

a calibration of threshold voltages used to interpret read voltages stored by a memory cell, a data retention check to determine whether the encoded data should be decoded, re-encoded, and re-written to the memory component, or an error-correcting code decode operation.

19. The system of claim 15, wherein the first trained machine learning model is a decision tree model, a neural network model, or a logistic regression model.

20. The system of claim 15, wherein the processing device is further to:

determine, using a second trained machine learning model, that an estimated raw bit error rate based on the population data satisfies a second threshold; and initiate a second media management operation in response to determining that the estimated raw bit error rate satisfies the second threshold, wherein the second media management operation is a different type operation than the first media management operation.

* * * * *